United States Patent [19]

Ochiai

[11] E Patent Number: Re. 31,678

[45] Reissued Date of Patent: Sep. 18, 1984

[54] SYSTEM FOR COLLECTING SOLAR ENERGY

[76] Inventor: Tsurunosuke Ochiai, 3169-6, Kumanohara-machi, Karatsu-shi, Saga-ken, Japan, 847

[21] Appl. No.: 453,321

[22] Filed: Dec. 27, 1982

Related U.S. Patent Documents

Reissue of:

[64] Patent No.: 4,307,936
Issued: Dec. 29, 1981
Appl. No.: 76,051
Filed: Sep. 17, 1979

[51] Int. Cl.[3] ..... G02B 5/16

[52] U.S. Cl. ..... 350/96.24; 126/417; 126/438; 350/96.10; 350/96.27

[58] Field of Search ..... 126/417, 438, 439, 440, 126/441, 451; 350/96.10, 96.24, 96.25, 96.27

[56] References Cited

U.S. PATENT DOCUMENTS

| | | | |
|---|---|---|---|
| 2,920,710 | 1/1960 | Howard | 350/96.10 X |
| 3,780,722 | 12/1973 | Swet | 126/451 |
| 4,026,267 | 5/1977 | Coleman | 350/96.24 X |
| 4,201,197 | 5/1980 | Dismer | 126/451 |
| 4,247,165 | 1/1981 | Versluis | 350/96.27 |

*Primary Examiner*—John D. Lee
*Attorney, Agent, or Firm*—Sprung, Horn, Kramer & Woods

[57] ABSTRACT

A system for collecting solar energy which comprises a thin faceplate made of a large number of optical fibers having respectively a diameter ranging from 0.5 micron to 2.0 micron tied up coherently in a bundle vertically to the plane of the faceplate, and a means for focusing the rays departing from the optical fibers of the faceplate.

The faceplate enables to let solar rays entering into the optical fibers from all directions within the numerical aperture of the fibers pass through the fibers to let rays parallel to the principal axis of the faceplate depart from the fibers. Accordingly, the system enables to collect solar energy with a high collecting efficiency with no special means for strictly following the sun.

FIG. 4 is a vertical sectional view of a system of this invention, where 1 is faceplate, 2 optical fibers composing the faceplate, 3 concave parabolic mirror, 4 convex parabolic mirror, 9 a bundle of optical fibers for transmission.

14 Claims, 7 Drawing Figures

SYSTEM FOR COLLECTING SOLAR ENERGY

Matter enclosed in heavy brackets [ ] appears in the original patent but forms no part of this reissue specification; matter printed in italics indicates the additions made by reissue.

BACKGROUND OF THE INVENTION

1. Field of the Invention

This invention relates to a new system for collecting the radiant energy of sunlight.

2. Description of the Prior Art

Heretofore, several systems for collecting the radiant energy of sunlight have been proposed. As an example seen in a solar-electric power plant or a solar furnace, sunlight is concentrated, to yield a high temperature, on a receiver by a large number of mirrors designed to follow the sun, or so-called heliostats, wherein each mirror must be individually moved by clockwork for strictly reflecting the solar rays into a fixed direction to the receiver, so that it is inevitable for the system to become very complicated in a large scale. A unit collector such as giant parabolic mirror on Fresnel lens as another example must be also designed to strictly follow the sun, otherwise the incident solar rays can not focus on one point, so that the efficiency for collecting solar energy lowers markedly. Many attempts for improving the follow-means have been made, but any of those is still complicated and expensive. We have now found that collecting the radiant energy of sunlight with a considerable high efficiency can be accomplished with no special follow-means.

SUMMARY OF THE INVENTION

An object of this invention is therefore to provide a system for collecting the radiant energy of sunlight with a considerable high efficiency with no special means for following the sun.

Another object of this invention is to provide a simple and cheap collector of solar energy.

Other objects will be apparent from the following description.

Thus, this invention relates to a system for collecting the radiant energy of sunlight which comprises a faceplate for receiving the parallel rays of sun which is a thin plate made of a large number of optical fibers having respectively a diameter ranging from 0.5 micron to 2.0 micron tied up coherently in a bundle vertically to the plane of the faceplate, and a means for focusing the parallel rays departing from optical fibers of the faceplate to concentrate the radiant energy outside the system.

DETAILED DESCRIPTION OF THE PREFERRED EMBODIMENTS

Figure 1:
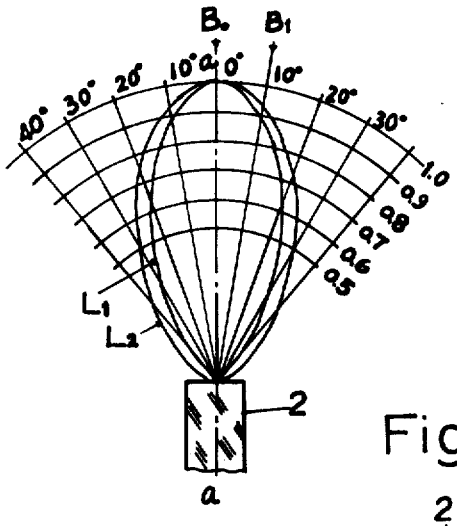
FIG. 1 shows directivity patterns based on Fraunhofer diffraction which is formed when beams of parallel light depart from the aperture of an optical fiber along the principal axis of the fiber.

The most essential feature of this invention consists in the faceplate. The faceplate is a plate made by a large number of optical fibers tied up coherently in a bundle vertically to the plane of the faceplate. Each diameter of the optical fibers is selected from a range of 0.5 micron to 2.0 micron, which is the gist of the faceplate. Thickness of the faceplate is not essential, but may be in a range of three to ten millimeters.

This faceplate works very effectively. According to this faceplate, the rays departing from each optical fiber of the faceplate have always a certain intensity component along the principal axis of each optical fiber, so that all the rays departing from all optical fibers of the faceplate has always some intensity component along the direction of principal axis of the faceplate, whenever solar rays enter into the faceplate from a direction being within about the numerical aperture of the optical fiber of the faceplate. Hence, numerical aperture stands for $\sin\theta=\sqrt{n_1^2-n_2^2}$, wherein $\theta$ represents angle of deviation from principal axis, $n_1$ represents refractive index of the optical fiber, and $n_2$ represents refractive index of the material surrounding the optical fiber. The value of numerical aperture varys depending on $n_1$ and $n_2$, but is exemplified as about sin 39°. Namely, the faceplate of this invention can produce, from all of its under surface, rays having a certain intensity as a component parallel to the principal axis of the faceplate, whenever solar rays enter into the faceplate from the direction area which is formed by a cone formed by the revolution around the principal axis of the line having an angle of about 39° between the line and the principal axis of the faceplate. The parallel rays produced can be easily focused by a fixed single means for focusing parallel rays having a definite direction. Namely, this faceplate enables to obviate the necessity of follow-means of the sun.

The reason why optical fibers work so effectively in the diameter range of 0.5–2.0 micron, will be given by the principal of Fraunhofer diffraction and the principle of reversibility of light-path. The illustration will be easier, when the incident rays are rays having a single wave length. The basic idea of this invention is that each diameter of optical fibers is selected from the diameter not larger than $1.22\lambda$, $\lambda$ is the wavelength of the incident light. The diameter range of optical fibers of the faceplate of this invention, 0.5–2.0 micron was selected in due consideration of the effective wave length band 0.3–3.0 $\mu$m of sunlight, and practical efficiencies.

The reason why the length of diameter is critical at $1.22\lambda$ will be given as follows. If beams of parallel light depart from the aperture of an optical fiber having an appropriate small diameter. Fraunhofer diffraction of beams will occur, so that the beams departing from the aperture generally form a three dimensional intensity distribution pattern, that is, a directivity pattern consisting of a main lobe and subsidery lobes. Generally, some region of zero intensity is formed between the main lobe and the subsidery lobes. But, if the diameter of the aperture is adequately selected, only a main lobe can be formed. This adequate diameter can be derived from the following principle. Fraunhofer diffraction shows a lobe-like diffraction having a directivity coefficient $(2J_1(x)/x)^2$, wherein $J_1(x)$ is Bessel function, $x=\pi d/\lambda \sin\gamma$, d is diameter of the aperture, $\lambda$ is wave length of incident beams of light, and $\gamma$ is the angle formed between the incident direction of beams and the principal axis of the aperture. When $(2J_1(x)/x)^2$ becomes zero, x becomes about 3.83, and $d/\lambda$ becomes 1.22, in which only main lobe is formed. Accordingly, if the diameter of optical fiber is not larger than $1.22\lambda$, parallel beams which enter into the aperture of optical fiber along the principal axis thereof, pass through the fiber and depart from another aperture thereof from a directivity pattern having only a main lobe and no subsidery lobes as shown in FIG. 1.

In FIG. 1, lobe $L_1$ is the directivity pattern based on Fraunhofer diffraction which is formed when beams of parallel light depart from the aperture of an optical fiber, the diameter of which is equal to $1.22\lambda$, $\lambda$ being the wavelength of the beams, and lobe $L_2$ is the one when the diameter is $1.00\lambda$. In FIG. 1, 2 is optical fiber, 0°, 10°, 20°, 30°, etc. is an angle of deviation from the principal axis of optical fiber, a—a, and the circular line of 1.0, 0.9, etc. is the line representing a relative intensity, assuming that the intensity at the principal axis is 1.00. The principle of reversibility of light-path teaches that the directivity pattern formed by the beams which advance upward in FIG. 1 can be wholly applied to the beams which advance downward in FIG. 1, so that the beams $B_0$ which enter downward into the optical fiber 2 along the principal axis a—a depart from the optical fiber as the beams having an intensity component along the principal axis a—a of 1.0; the beam $B_1$ which enter downward into the optical fiber 2 from the direction deviated by 10° from the principal axis a—a depart from the optical fiber as the beams having an intensity component along the principal axis a—a of 0.89; the beams of 20°, 0.63; the beams of 30°, 0.36; etc.

As will be clearly understood from the above illustrations, the faceplate of this invention enables to let parallel rays of sunlight entering into the optical fibers from all directions within the numerical aperture of the optical fibers pass through the optical fibers to depart, from the outlet apertures of all the optical fibers, a number of rays, any of which is parallel to one another and to the principal axis of the faceplate, and has a certain intensity relating to the angle formed between the incident direction of sunlight and the principal axis of the faceplate. The parallel rays departed from the faceplate can be easily focused by a single means for focusing fixed to the faceplate. Thus, the faceplate of this invention enables to eliminate the necessity of strictly following the incident direction of sunlight.

The means for focusing parallel rays departing from optical fibers of the faceplate may be any of conventional and new means for focusing parallel rays. An example is a concave parabolic mirror accompanied with a secondary small convex parabolic mirror positioned at the focal area of the concave parabolic mirror. Another example is Fresnel lens.

Figure 2:
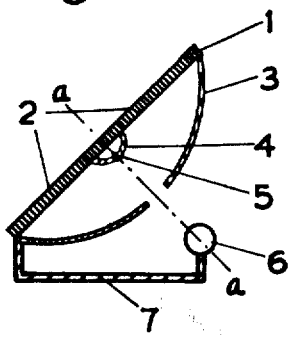
FIG. 2 is a vertical sectional view of a system of this invention which as a focusing means consisting of two parabolic mirrors.

As shown in FIG. 2, the former parabolic mirrors are positioned below the faceplate. The concave parabolic mirror is one for focusing parallel rays departing from the faceplate, so that the focus of the concave parabolic mirror surface is formed below the faceplate. Secondary small convex parabolic mirror is positioned at the focal area of the concave parabolic mirror. The diameter of aperture of the secondary parabolic mirror can be selected from the range of 1/20–1/10 times as much as the diameter of aperture of the primary concave parabolic mirror, so that rays reflecting on the convex surface of the secondary mirror can focus on or below the surface of the primary mirror, according to the purpose of using the collecting system.

FIG. 2 shows an example of the collecting system of this invention using parabolic mirrors' means, wherein 1 is faceplate, 2 is optical fibers composing the faceplate, 3 is primary concave parabolic mirror, and 4 is secondary small convex parabolic mirror. 5 represents focus of the primary concave parabolic mirror. 6 is objective substance for applying the solar energy collected. 7 is a means for fixing the objective substance. a—a is principal axis of the faceplate. The rays of sunlight pass through optical fibers 2 of faceplate 1 to depart therefrom as rays having an intensity component parallel to the principal axis a—a, and the parallel rays reflect on the surface of mirror 3 to focus on the surface of mirror 4, and then to reflect thereon to focus on objective substance 6, so that the objective substance 6 is heated.

Figure 3:
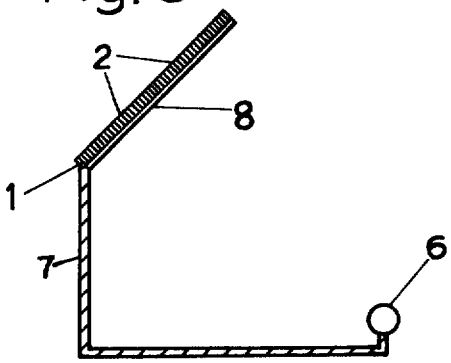
FIG. 3 is a vertical sectional view of another system of this invention which has a focusing means of a Fresnel lens.

FIG. 3 shows another example of the collecting system of this invention using a Fresnel lens, wherein 8 is Fresnel lens, and 1, 2, 6, 7 represents respectively the same meaning as in FIG. 2.

As is seen in FIGS. 2 and 3, parabolic means makes the collecting system thin, and Fresnel lens means makes the one rather thick.

Figure 4:
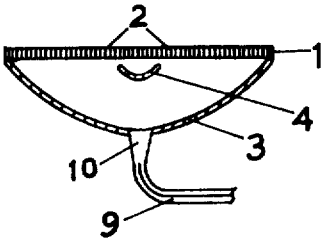
FIG. 4 is a vertical sectional view of a system of this invention which has a focusing means consisting of two parabolic mirrors, and a means for transferring the focused energy.

Focused solar energy can be transferred to a remote place. FIG. 4 shows an example of the system for solar energy focused to transfer to a remote place. The rays reflected on the surface of secondary mirror 4 focus at the central area on the surface of primary mirror 3. The focused rays are transferred through a bundle of optical fibers for transmission 9 to a remote place. The diameters of optical fibers for transmission may be defined economically. The bundle of optical fibers are connected a transparent cone 10 which is connected with the primary mirror 3 at its central lacked part.

Figure 5:
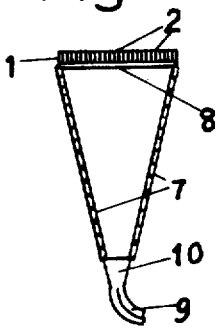
FIG. 5 is a vertical sectional view of another system of this invention which has a focusing means of a Fresnel lens and a means for transferring the focused energy.

FIG. 5 shows another example of the system to a remote place, in which a Fresnel lens 8 is used as a means for focusing.

Figure 6:
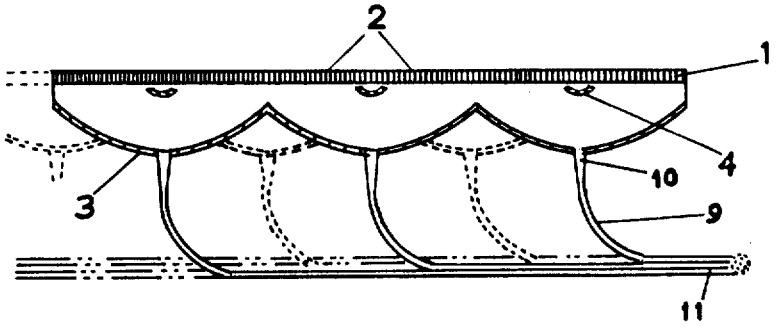
FIG. 6 is a vertical sectional view of a system of this invention which is compounded with a number of unit systems of FIG. 4.

FIG. 6 shows an example of the big system which is compounded with a number of unit systems shown in FIG. 4. All of the bundles 9 of optical fibers from unit systems is gathered to make one big bundle 11 to transfer to one remote place.

Figure 7:
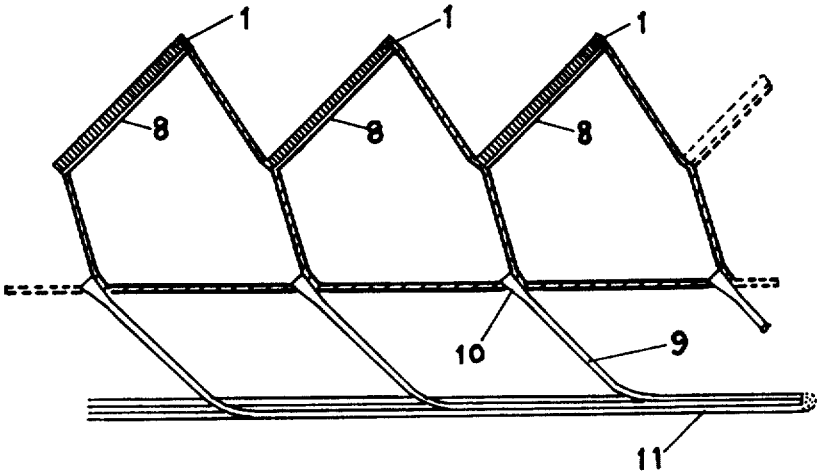
FIG. 7 is a vertical sectional view of a system of this invention which is compounded with a number of unit systems of FIG. 5.

FIG. 7 shows another example of the big system compounded with units shown in FIG. 5.

The faceplate can be one big plane plate as in FIG. 6, and can be the one compounded in a jagged sectional view as in FIG. 7. The form of faceplate in FIGS. 6 and 7 is exchangeable with each other. The plane faceplate will be suitable to be equipped on the plane facing the sun's path, for example declined roofs. The faceplate in a jagged sectional form will be suitable to be equipped on horizontal roofs, or especially on vertical walls. Many other modifications for compounding units of the collecting system will be considered within the scope of this invention.

Advantages of this invention are as follows.

(1) The system of this invention obviates the need for a mechanism for the strict follow of the solar direction.

(2) The system can be made in very thin form in the parabolic mirrors' one.

(3) Collecting solar energy can be conducted under the collecting system.

(4) Collected solar energy can be easily transferred and gathered to a remote plate.

(5) The system is cheap, and easy to equip on any place such as roof, wall, water surface, etc.

(6) The system promises very high collecting coefficient of solar energy with no special follow-mechanism.

This system can be widely used, for example, as collector for solar house heating and cooling and as a high temperature collector used in solar electric power plant or solar furnace.

What is claimed is:

1. A system for collecting radiant energy of sunlight which comprises a faceplate for receiving parallel rays of sunlight which is a thin plate made of a large number of optical fibers having respectively a diameter ranging from 0.5 micron to 2.0 micron tied up coherently in a bundle vertically to the plane of the faceplate, and a means for focusing the parallel rays departing from the optical fibers of the faceplate to concentrate the radiant energy outside the system.

2. A system as claimed in claim 1, wherein the focusing means is a concave parabolic mirror accompanied with a small convex parabolic mirror positioned at the focal area of the concave parabolic mirror, the concave parabolic mirror being positioned below the faceplate and having a lacked area at the central part of the mirror, and the small convex parabolic mirror reflecting the rays reflected from the concave parabolic mirror to focus at or below the lacked area of the concave parabolic mirror.

3. A system as claimed in claim 2, wherein the object to give solar energy is directly placed at the position which is the focus of the convex parabolic mirror and is below the concave parabolic mirror.

4. A system as claimed in claim 2, wherein the central lacked area of the concave parabolic mirror is connected with a transparent cone which is connected with a bundle of optical fibers for transmission to transfer the focused solar rays to a remote place.

5. A system as claimed in claim 1, wherein the focusing means is a Fresnel lens.

6. A system as claimed in claim 5, wherein the object to give solar energy is directly placed at the focus of the Fresnel lens.

7. A system as claimed in claim 5, wherein, the focal area of the Fresnel lens is connected with a transparent cone which is connected with a bundle of optical fibers for transmission to transfer the focused solar rays to a remote place.

8. A system for collecting radiant energy of sunlight which is compounded with a number of units, the unit of which comprises a faceplate for receiving parallel rays of sunlight which is a thin plate made of a large number of optical fibers having respectively a diameter ranging from 0.5 micron to 2.0 micron tied up coherently in a bundle vertically to the plane of the faceplate, a means for focusing the parallel rays departing from the optical fibers of the faceplate, and a bundle of optical fibers for transmission which is connected with the focal area of the focusing means, and the bundles of optical fibers for transmission are collected to a remote destination.

9. A system as claimed in claim 8, wherein the compounded faceplate is one big plane faceplate compounded with a number of unit faceplates.

10. A system as claimed in claim 8, wherein the compounded faceplate is a big one compounded, in a saw-toothed sectional form, with a number of unit faceplates in such a manner that one unit faceplate per one tooth is equipped in parallel to one another.

*11. A faceplate for receiving parallel rays of sunlight which is a thin plate made of a large number of optical fibers having respectively a diameter ranging from 0.5 micron to 2.0 micron tied up coherently in a bundle vertically to the plane of the faceplate.*

*12. A compounded faceplate for receiving parallel rays of sunlight which is a thin plate made of a large number of optical fibers having respectively a diameter ranging from 0.5 micron to 2.0 micron tied up coherently in a bundle vertically to the plane of the faceplate.*

*13. A compounded faceplate as claimed in claim 12, wherein the compounded faceplate is one big plane faceplate compounded with a number of unit faceplates.*

*14. A compounded faceplate as claimed in claim 12, wherein the compounded faceplate is a big one compounded in a saw-toothed sectional form, with a number of unit faceplates in such a manner that one unit faceplate per one tooth is equipped in parallel to another.*

* * * * *